(12) United States Patent
Zhou et al.

(10) Patent No.: US 11,388,839 B2
(45) Date of Patent: Jul. 12, 2022

(54) POWER ELECTRONICS COOLING ASSEMBLIES AND METHODS FOR MAKING THE SAME

(71) Applicants: Toyota Motor Engineering & Manufacturing North America, Inc., Plano, TX (US); Toyota Jidosha Kabushiki Kaisha, Toyota (JP)

(72) Inventors: Feng Zhou, Ann Arbor, MI (US); Shohei Nagai, Aichi (JP)

(73) Assignees: TOYOTA MOTOR ENGINEERING & MANUFACTURING NORTH AMERICA, INC., Plano, TX (US); TOYOTA JIDOSHA KABUSHIKI KAISHA, Aichi-ken (JP)

(*) Notice: Subject to any disclaimer, the term of this patent is extended or adjusted under 35 U.S.C. 154(b) by 0 days.

(21) Appl. No.: 16/993,736

(22) Filed: Aug. 14, 2020

(65) Prior Publication Data

US 2022/0053666 A1 Feb. 17, 2022

(51) Int. Cl.
*H05K 7/20* (2006.01)
*H05K 1/02* (2006.01)
*H05K 1/18* (2006.01)

(52) U.S. Cl.
CPC ....... *H05K 7/20254* (2013.01); *H05K 1/0203* (2013.01); *H05K 1/185* (2013.01); *H05K 7/20927* (2013.01); *H05K 2201/064* (2013.01); *H05K 2201/066* (2013.01)

(58) Field of Classification Search
CPC .......... H05K 7/20927; H05K 7/20254; H05K 7/2089; H05K 7/209; H05K 7/2039; H05K 7/20; H05K 7/20809; H05K 7/20772; H05K 1/0203; H05K 1/185; H05K 2201/064; H05K 2201/066; H01L 23/473

See application file for complete search history.

(56) References Cited

U.S. PATENT DOCUMENTS

| | | |
|---|---|---|
| 8,232,637 B2 | 7/2012 | Beaupre et al. |
| 9,420,721 B2 | 8/2016 | Campbell et al. |
| 2010/0157526 A1* | 6/2010 | Beaupre ............... H01L 23/473 361/689 |
| 2010/0208427 A1* | 8/2010 | Horiuchi ........... H05K 7/20927 361/699 |
| 2010/0264520 A1* | 10/2010 | Ogawa ................ H01L 23/3735 257/618 |
| 2013/0264702 A1* | 10/2013 | Nishi ...................... H01L 23/36 257/712 |
| 2014/0077353 A1 | 3/2014 | Tazoe |
| 2016/0343640 A1* | 11/2016 | Gohara ............. H05K 7/20927 |
| 2020/0388557 A1* | 12/2020 | Yoo .................... H05K 7/20927 |

FOREIGN PATENT DOCUMENTS

| | | |
|---|---|---|
| CN | 107316843 A | 11/2017 |
| EP | 0603860 A2 | 6/1994 |
| GB | 2358960 B | 8/2003 |

* cited by examiner

*Primary Examiner* — Adam B Dravininkas
(74) *Attorney, Agent, or Firm* — Dinsmore & Shohl LLP

(57) ABSTRACT

A power electronics module includes a cold plate manifold, a heat sink base layer at least partially embedded in the cold plate manifold, an electrically-insulating layer in direct contact with the heat sink base layer, a conductive substrate positioned on the electrically-insulating layer, and a power electronics device coupled to and in direct contact with the conductive substrate.

18 Claims, 12 Drawing Sheets

POWER ELECTRONICS COOLING ASSEMBLIES AND METHODS FOR MAKING THE SAME

TECHNICAL FIELD

The present specification relates to power electronics cooling devices and methods for making the same.

BACKGROUND

Power electronics devices embedded in printed circuit boards may be utilized in a variety of applications. For example, in vehicle applications, printed circuit board embedded power electronics devices may be used to convert direct current (DC) into alternating current (AC). In such applications, power electronics devices may be thermally coupled to heat sinks and the like to dissipate heat from the power electronics devices. Conventional printed circuit board embedded power electronics modules may include one or more intermediate layers positioned between the power electronics device and the heat sink, which may impede the dissipation of heat from the power electronics devices. Further conventional heat sinks may be coupled to the power electronics modules through mechanical fasteners and/or sealing elements that increase assembly costs and may allow cooling fluid to leak from the heat sink.

SUMMARY

Accordingly, a need exists for improved printed circuit board embedded power electronics modules including improved cooling features and improved method for coupling power electronics devices to a cold plate manifold. Printed circuit board embedded power electronics modules according to the present disclosure generally include a heat sink base layer that is directly bonded to a cold plate manifold. For example, in embodiments according to the present disclosure, the heat sink base layer may include one or more engagement features that are at least partially embedded within the cold plate manifold to couple the heat sink base layer to the cold plate manifold, thereby coupling the heat sink base layer to the cold plate manifold without requiring the use of mechanical fasteners. In some embodiments, power electronics modules according to the present disclosure generally include power electronics devices in direct contact with conductive substrates that are in direct contact with an electrically-insulating layer. The electrically-insulating layer is in direct contact with a cold plate manifold. The direct contact between the conductive substrates and the cold plate manifold with the electrically-insulating layer minimizes intermediate components positioned between the power electronics devices and the cold plate manifold, thereby minimizing thermal resistance between the power electronics devices and the cold plate manifold. By minimizing thermal resistance between the power electronics devices and the cold plate manifold, the amount of heat dissipated from the power electronics devices can be increased as compared to configurations including intermediate components positioned between the power electronics devices and the cold plate manifold. By increasing the amount of heat that can be dissipated from the power electronics devices, the power electronics devices fan be maintained at lower operating temperatures. Additionally, by increasing the amount of heat that can be dissipated from the power electronics devices, the power electronics devices can be operated at higher power outputs while maintaining a similar operating temperature as compared to conventional configurations.

In one embodiment, a power electronics module includes a cold plate manifold, a heat sink base layer at least partially embedded in the cold plate manifold, an electrically-insulating layer in direct contact with the heat sink base layer, a conductive substrate positioned on the electrically-insulating layer, and a power electronics device coupled to and in direct contact with the conductive substrate.

In another embodiment, a method for forming a power electronics module includes positioning a conductive substrate over and in direct contact with a first surface of an electrically-insulating layer, positioning a heat sink base layer over and in direct contact with a second surface of the electrically-insulating layer opposite the conductive substrate, coupling a power electronics device to the conductive substrate such that the power electronics device is in direct contact with the conductive substrate, pressing the heat sink base layer into a plastic cold plate manifold and heating the heat sink base layer, thereby melting at least a portion of the plastic cold plate manifold to couple the heat sink base layer to the plastic cold plate manifold.

In yet another embodiment, a power electronics module includes a cold plate manifold structurally configured to dissipate thermal energy, a heat sink base layer directly bonded to the cold plate manifold, an electrically-insulating layer in direct contact with the heat sink base layer, a conductive substrate positioned on and in direct contact with the electrically-insulating layer, a power electronics device positioned on and in direct contact with the conductive substrate, a printed circuit board layer that at least partially encapsulates the conductive substrate and the power electronics device, and a driver circuit component positioned on a surface of the printed circuit board layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Power electronics modules according to the present disclosure generally include a heat sink base layer that is directly bonded to a cold plate manifold. For example, in embodiments according to the present disclosure, the heat sink base layer may include one or more engagement features that are at least partially embedded within the cold plate manifold to couple the heat sink base layer to the cold plate manifold, thereby coupling the heat sink base layer to the cold plate manifold without requiring the use of mechanical fasteners. In some embodiments, power electronics modules according to the present disclosure generally include power electronics devices in direct contact with conductive substrates that are in direct contact with an electrically-insulating layer. The electrically-insulating layer is in direct contact with a cold plate manifold. The direct contact between the conductive substrates and the cold plate manifold with the electrically-insulating layer minimizes intermediate components positioned between the power electronics devices and the cold plate manifold, thereby minimizing thermal resistance between the power electronics devices and the cold plate manifold. By minimizing thermal resistance between the power electronics devices and the cold plate manifold, the amount of heat dissipated from the power electronics devices can be increased as compared to configurations including intermediate components positioned between the power electronics devices and the cold plate manifold. By increasing the amount of heat that can be dissipated from the power electronics devices, the power electronics devices can be maintained at lower operating temperatures. Additionally, by increasing the amount of heat that can be dissipated from the power electronics devices, the power electronics devices can be operated at higher power outputs while maintaining a similar operating temperature as compared to conventional configurations. These and other embodiments will now be described with reference to the appended figures.

Figure 1:
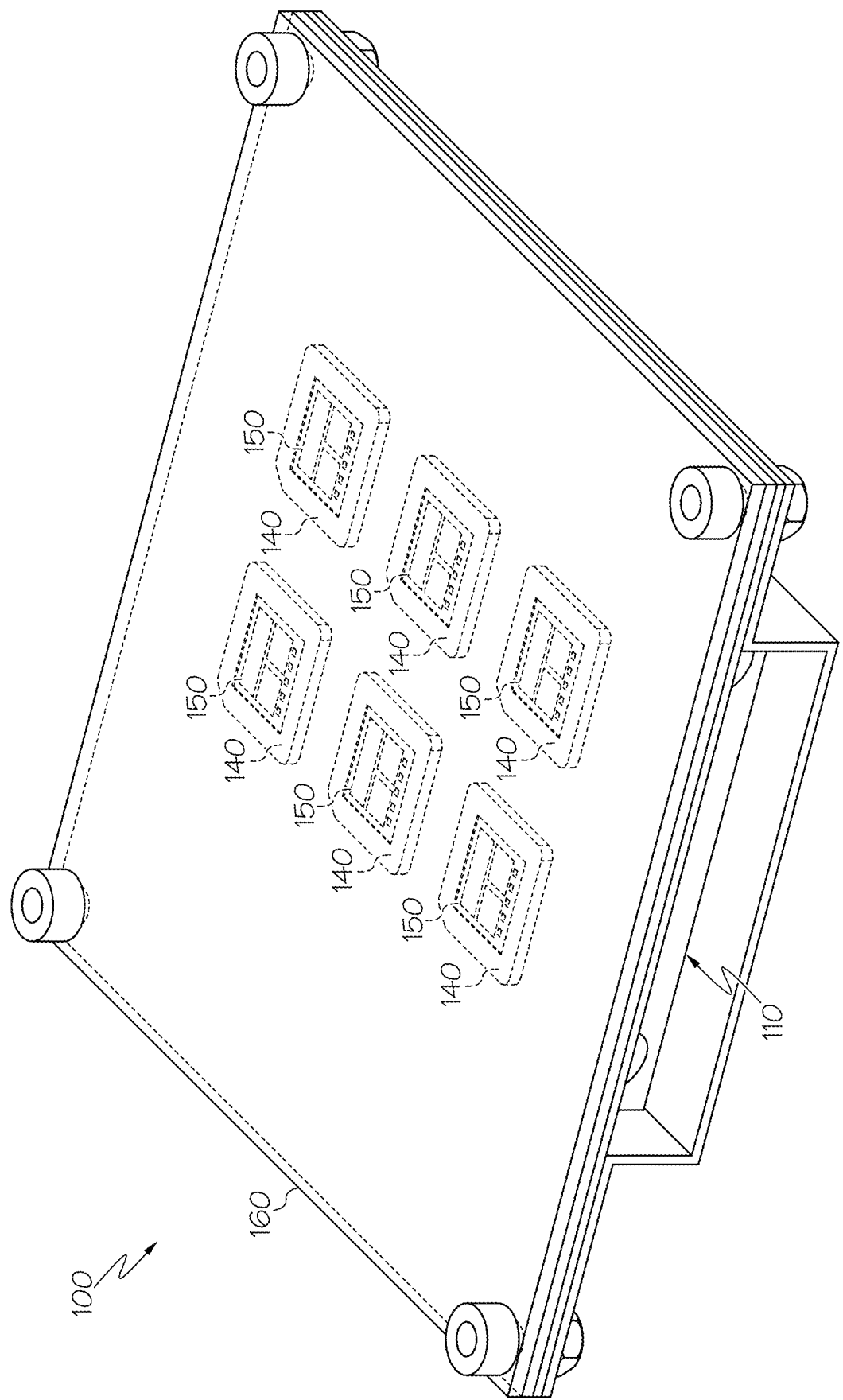
FIG. 1 schematically depicts a perspective view of power electronics module, according to one or more embodiments shown and described herein.
Figure 2:
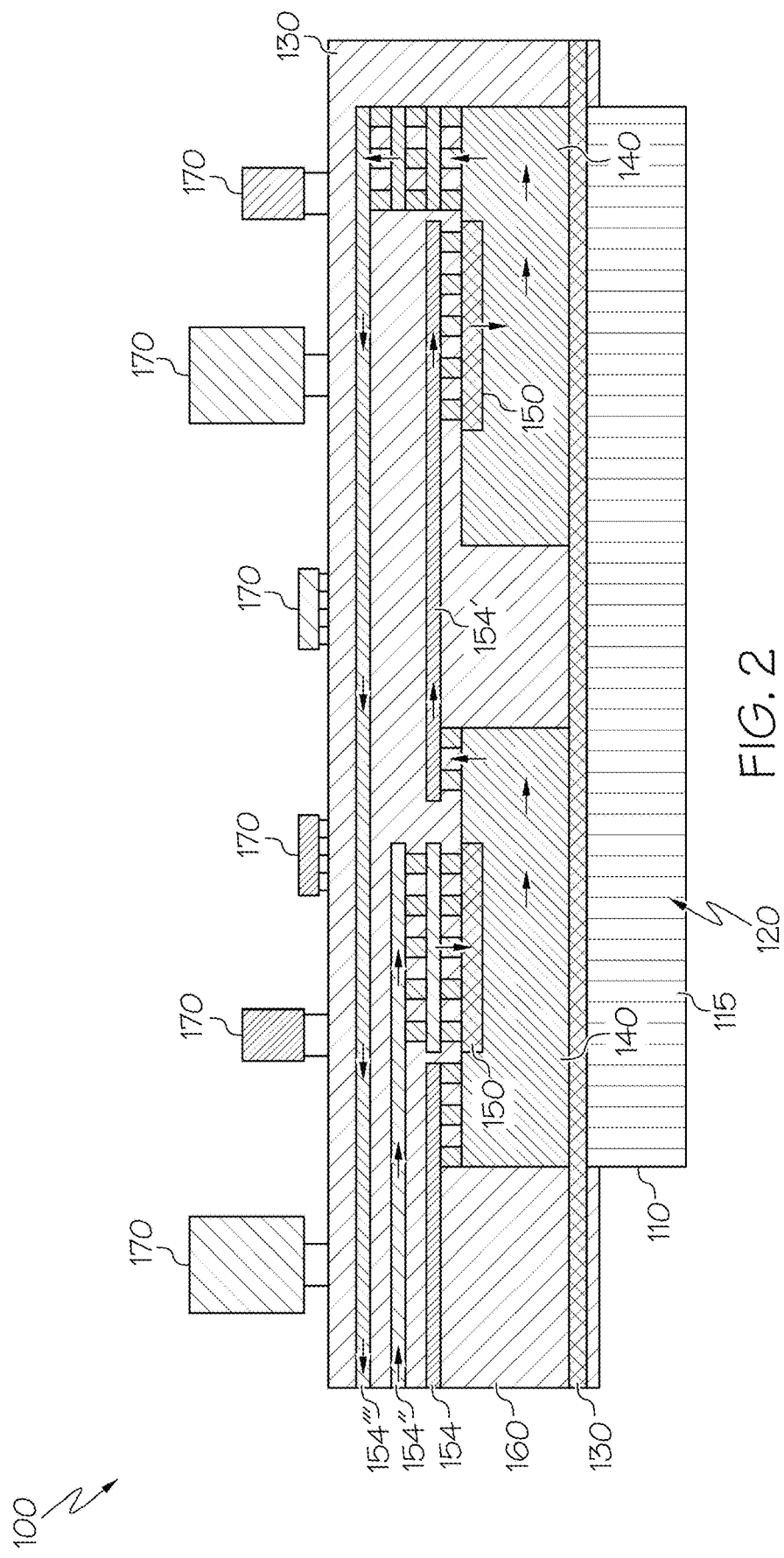
FIG. 2 schematically depicts a section view of the power electronics module of FIG. 1, according to one or more embodiments shown and described herein.

Referring initially to FIGS. 1 and 2, a perspective view and a section view of a power electronics module 100 are schematically depicted, respectively. In embodiments, the power electronics module 100 generally includes a cold plate manifold 110, a heat sink base layer 120, an electrically-insulating layer 130, one or more conductive substrates 140, one or more power electronics devices 150, a printed circuit board layer 160, and one or more driver circuit components 170.

Figure 3A:
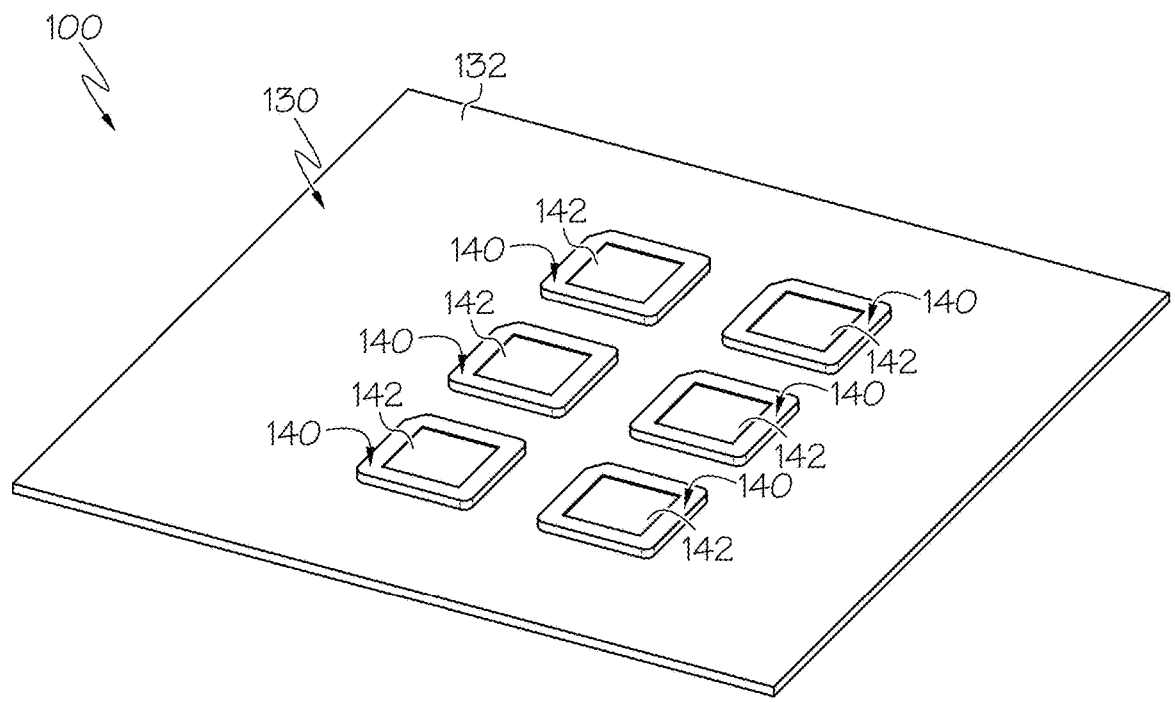
FIG. 3A schematically depicts a perspective view of a heat sink base layer, an electrically-insulating layer, and one or more conductive substrates of the power electronics module of FIG. 1, according to one or more embodiments shown and described herein.
Figure 3B:
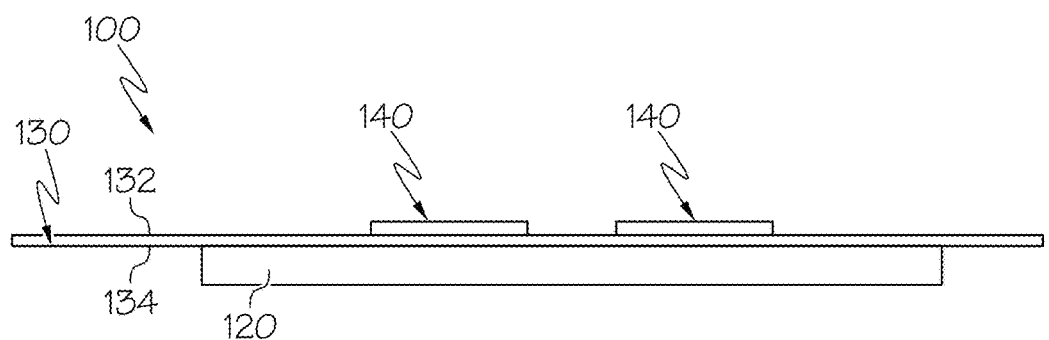
FIG. 3B schematically depicts a front view of the heat sink base layer, the electrically-insulating layer, and the one or more conductive substrates of the power electronics module of FIG. 1, according to one or more embodiments shown and described herein.

Referring to FIGS. 2, 3A, and 3B, a perspective view and a front view of the electrically-insulating layer 130, the heat sink base layer 120, and the one or more conductive substrates 140 is schematically depicted, respectively. In embodiments, the electrically-insulating layer 130 is positioned between the heat sink base layer 120 and the one or more conductive substrates 140. The heat sink base layer 120 and the one or more conductive substrates 140, in embodiments, may be electrically isolated from one another by the electrically-insulating layer 130. In embodiments, the electrically-insulating layer 130 is formed of a material that restricts the flow of electrical current, for example and without limitation, Alumina ($Al_2O_3$), Aluminum Nitride (AlN), Beryllium Oxide (BeO), or the like.

In some embodiments, the one or more conductive substrates 140 are spaced apart from one another on the electrically-insulating layer 130. In this way, in some embodiments, the one or more conductive substrates 140 may be electrically isolated from one another. While in the embodiment depicted in FIG. 3B the power electronics module 100 includes six conductive substrates 140, it should be understood that this is merely an example, and power electronics modules 100 according to the present disclosure may include any suitable number of power electronics devices 150 positioned on the electrically-insulating layer 130. In embodiments, the one or more conductive substrates 140 may be formed of an electrically conductive metal, such as copper or the like.

In some embodiments, the one or more conductive substrates 140 may define cavities 142 extending inwardly into the one or more conductive substrates 140. The one or more power electronics devices 150 (FIG. 1) may be positioned at least partially within the cavities 142, as described in greater detail herein.

In some embodiments, the one or more conductive substrates 140 directly contact the electrically-insulating layer 130. For example, in some embodiments, the one or more conductive substrates 140 are in direct contact with a first surface 132 of the electrically-insulating layer 130. In embodiments, the one or more conductive substrates 140 may be coupled to the electrically-insulating layer 130 through any suitable connection, for example and without limitation a sintered connection, a welded connection, or the like.

In some embodiments, the heat sink base layer 120 directly contacts the electrically-insulating layer 130. For example, in some embodiments, the heat sink base layer 120 is in direct contact with a second surface 134 of the electrically-insulating layer 130. In the embodiment depicted in FIG. 3B, the second surface 134 of the electrically-insulating layer 130 is positioned opposite the first surface 132 of the electrically-insulating layer 130, such that the heat sink base layer 120 is positioned opposite the one or more conductive substrates 140. In embodiments, the heat sink base layer 120 may be coupled to the electrically-insulating layer 130 through any suitable connection, for example and without limitation, a sintered connection, a welded connection, or the like. The heat sink base layer 120, in embodiments, may be formed of a material that conducts thermal energy, such as aluminum, copper, or the like.

Figure 4:
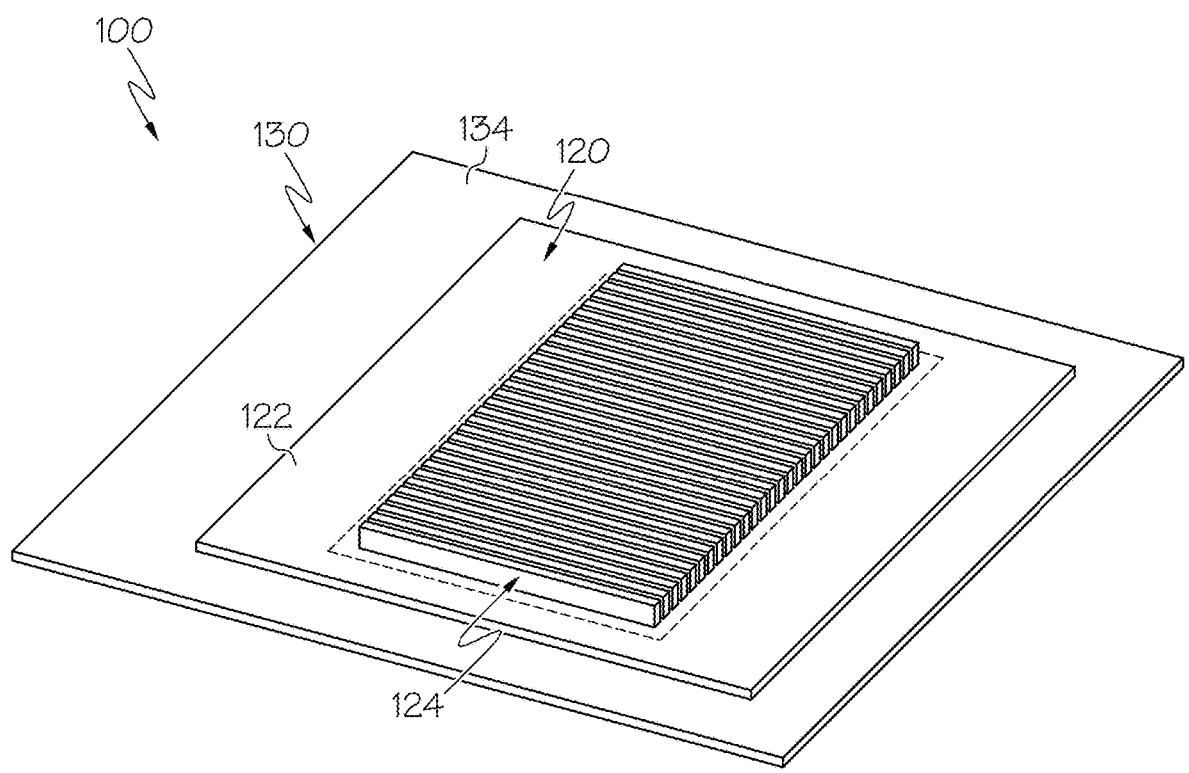
FIG. 4 schematically depicts a bottom view of the electrically-insulating layer and the heat sink base layer of the power electronics module of FIG. 1, according to one or more embodiments shown and described herein.

Referring to FIG. 4, a bottom perspective view of the electrically-insulating layer 130 and the heat sink base layer 120 is schematically depicted. In embodiments, the heat sink base layer 120 defines one or more fins 124 extending outward from the heat sink base layer 120. In embodiments, the one or more fins 124 may assist in transferring thermal energy from the heat sink base layer 120 to cooling fluid surrounding the one or more fins 124. For example, in embodiments, the one or more fins 124 may be positioned at least partially within a fluid passageway 115 (FIG. 2) of the cold plate manifold 110 (FIG. 2), as described in greater detail herein. The one or more fins 124 may have any shape suitable for transferring thermal energy, for example and without limitation, plate fins, pin fins, wavy fins, or the like.

In embodiments, the heat sink base layer 120 defines an outer perimeter region 122 positioned around the one or more fins 124. The outer perimeter region 122 may be utilized to couple the heat sink base layer 120, and accordingly the electrically-insulating layer 130 and the one or more conductive substrates 140 (FIG. 3A), to the cold plate manifold 110 (FIG. 2).

Figure 5:
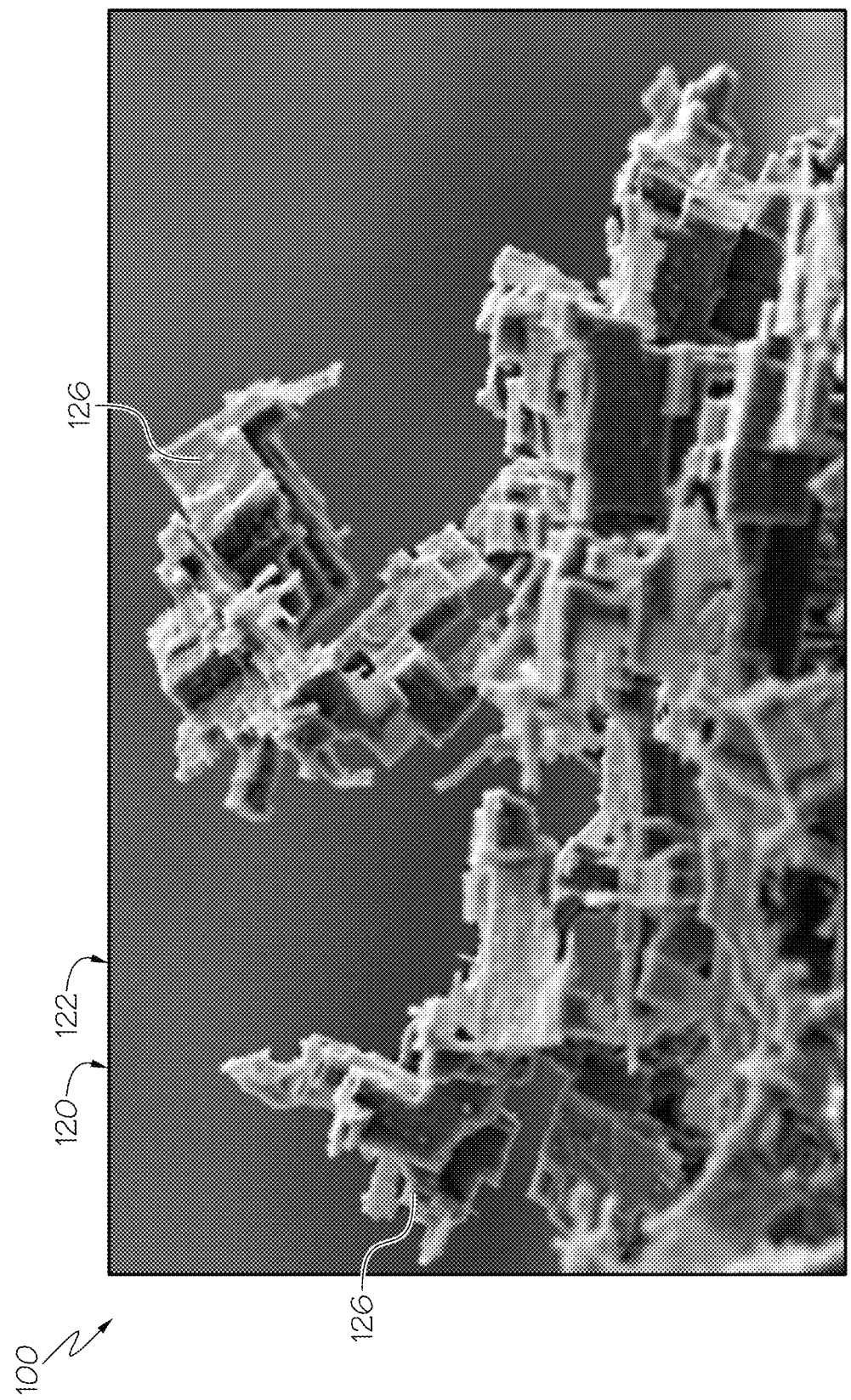
FIG. 5 schematically depicts an enlarged view of a portion of the heat sink base layer of the power electronics module of FIG. 1, according to one or more embodiments shown and described herein.

For example and referring to FIGS. 4 and 5, an enlarged view of the outer perimeter region 122 of the heat sink base layer 120 is schematically depicted. In some embodiments, the outer perimeter region 122 of the heat sink base layer 120 defines an etched surface including at least one outwardly-extending engagement feature 126. In some embodiments, the outwardly-extending engagement feature 126 may engage the cold plate manifold 110 (FIG. 2) to couple the heat sink base layer 120, and accordingly the electrically-insulating layer 130 and the one or more conductive substrates 140, to the cold plate manifold 110. The at least one outwardly-extending engagement feature 126 formed through any suitable process, for example and without limitation, chemical etching or the like.

Figure 6:
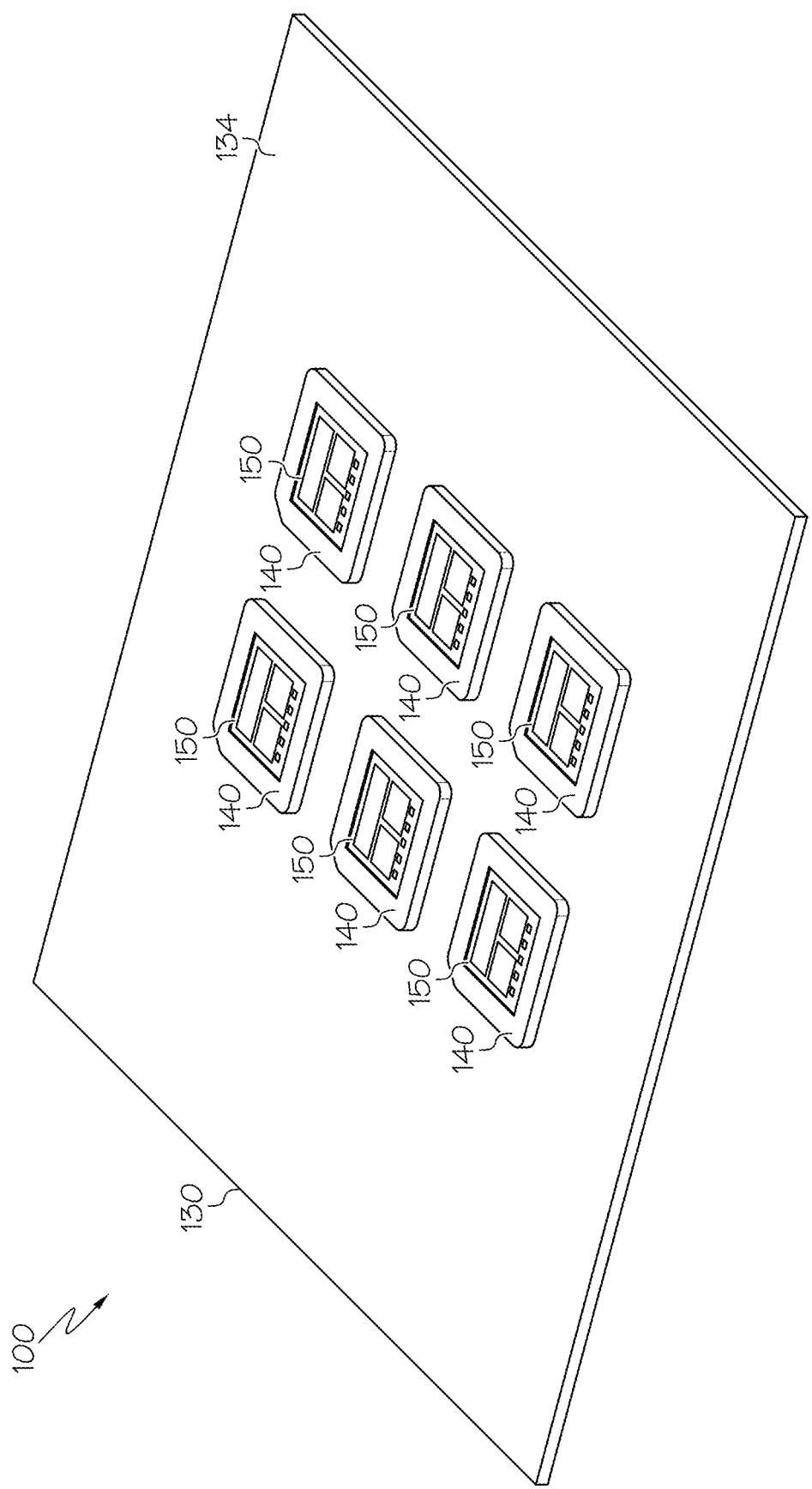
FIG. 6 schematically depicts the electrically-insulating layer and the one or more conductive substrates of FIG. 3A with one or more power electronics devices positioned on the one or more conductive substrates, according to one or more embodiments shown and described herein.

Referring to FIGS. 2 and 6, a perspective view of the electrically-insulating layer 130, the one or more conductive substrates 140, and the one or more power electronics devices 150 is schematically depicted. In embodiments, the one or more power electronics devices 150 may be positioned within the cavities 142 (FIG. 3A) of the one or more conductive substrates 140. The one or more power electronics devices 150, in embodiments, may directly contact the one or more conductive substrates 140. In some embodiments, the one or more power electronics devices 150 may be coupled to the one or more conductive substrates 140 through any suitable connection, for example and without limitation, a sintered connection, a welded connection, or the like.

In embodiments, the one or more power electronics devices 150 may include any suitable device a semiconductor device such as, but not limited to, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof. In some embodiments, the power electronics device 150 may include a wide-bandgap semiconductor, and may be formed from any suitable material such as, but not limited to, silicon carbide (SiC), silicon dioxide ($SiO_2$), aluminum nitride (AlN), gallium nitride (GaN), and boron nitride (BN), and the like. In some embodiments, the power electronics device 150 may operate at high current and under high temperatures, for example in excess of 250° C.

Figure 7:
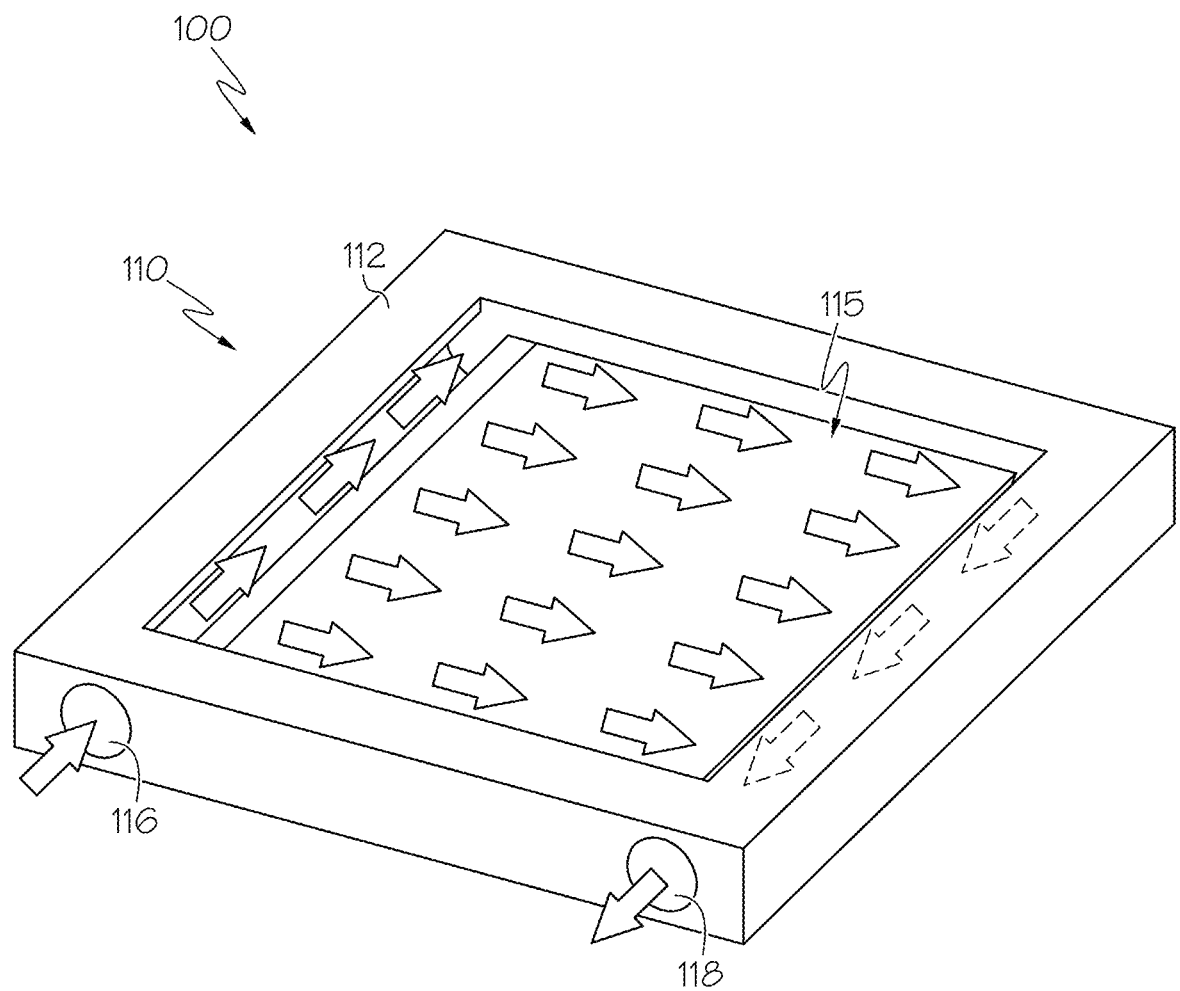
FIG. 7 schematically depicts a perspective view of a cold plate manifold of the power electronics module of FIG. 1, according to one or more embodiments shown and described herein.

Referring to FIG. 7, a perspective view of the cold plate manifold 110 is schematically depicted. The cold plate manifold 110, in embodiments, is structurally configured to dissipate thermal energy. In embodiments, the cold plate manifold 110 defines an inlet 116 and an outlet 118, and a fluid passageway 115 that extends between the inlet 116 and the outlet 118. Cooling fluid can be passed into the cold plate manifold 110 through the inlet 116, move along the fluid passageway 115, and exit the cold plate manifold 110 through the outlet 118. As the cooling fluid moves through the cold plate manifold 110, the cooling fluid may absorb thermal energy, thereby removing thermal energy from the power electronics module 100, as described in greater detail herein.

In embodiments, the cold plate manifold 110 defines an outer wall 112 that at least partially encloses the fluid passageway 115. In some embodiments, the heat sink base layer 120 may be coupled to the outer wall 112 to couple the heat sink base layer 120, and accordingly the electrically-insulating layer 130, the one or more conductive substrates 140, and the one or more power electronics devices 150, to the cold plate manifold 110. The cold plate manifold 110, in embodiments, is a plastic manifold formed of a plastic material, such as a polymer or the like. By forming the cold plate manifold 110 of a plastic, the shape of the cold plate manifold 110 can be tailored to maximize the transfer of thermal energy. Further, by forming the cold plate manifold 110 of a plastic, the weight of the cold plate manifold 110 may be minimized as compared to cold plate manifolds made of metallic materials, thereby reducing the overall weight of the power electronics module 100. In vehicular applications, by minimizing the overall weight of the power electronics module 100, the efficiency of the vehicle may be increased as compared to vehicles including conventional power electronics modules. Further in embodiments in which the cold plate manifold 110 is formed from a plastic, manufacturing costs may be reduced as compared to conventional cold plate manifolds formed of metallic materials.

Figure 8A:
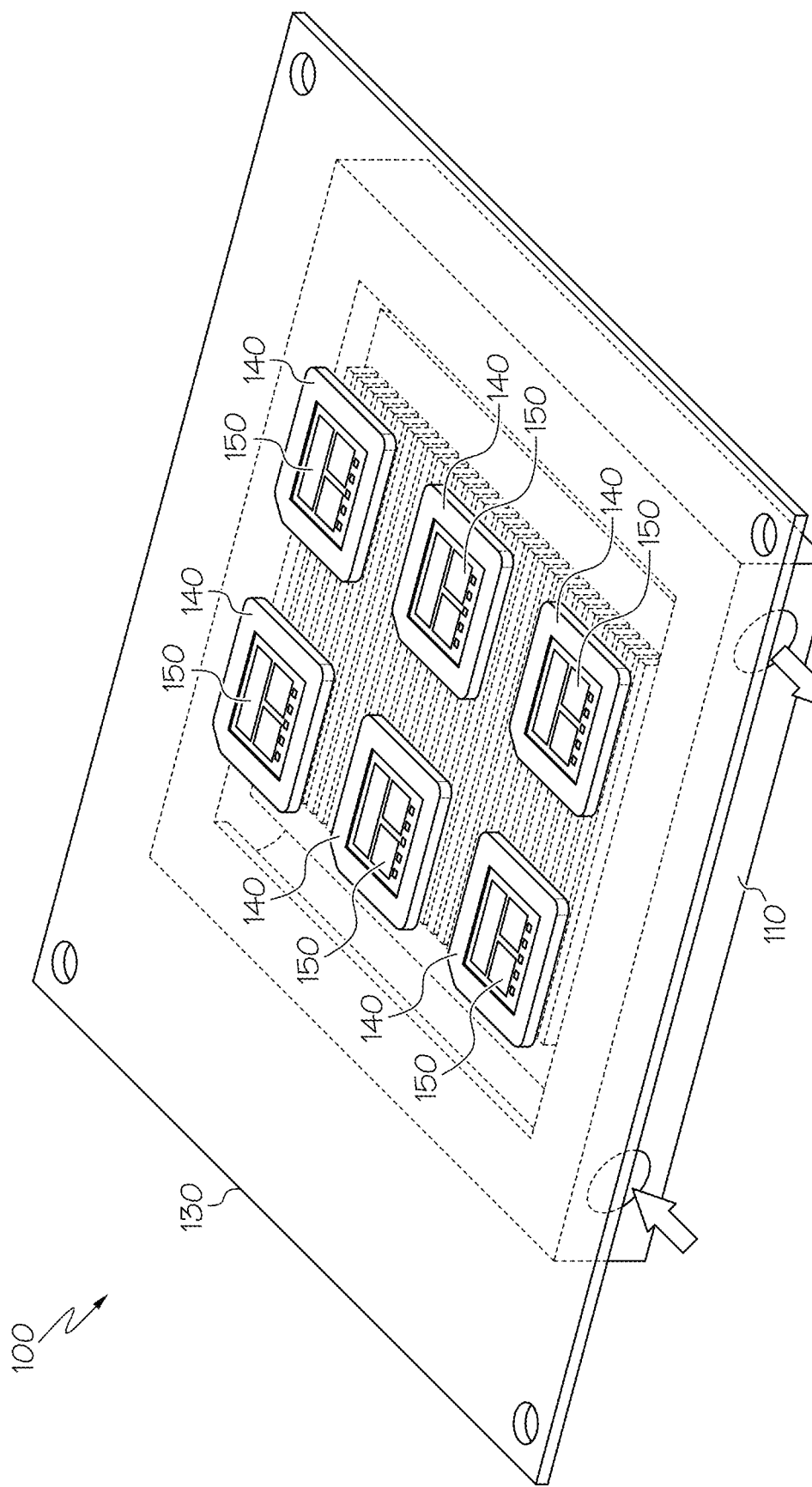
FIG. 8A schematically depicts a perspective view of the heat sink base layer, the electrically-insulating layer, the one or more conductive substrates, the one or more power electronics devices, and the cold plate manifold of the power electronics module of FIG. 1, according to one or more embodiments shown and described herein.
Figure 8B:
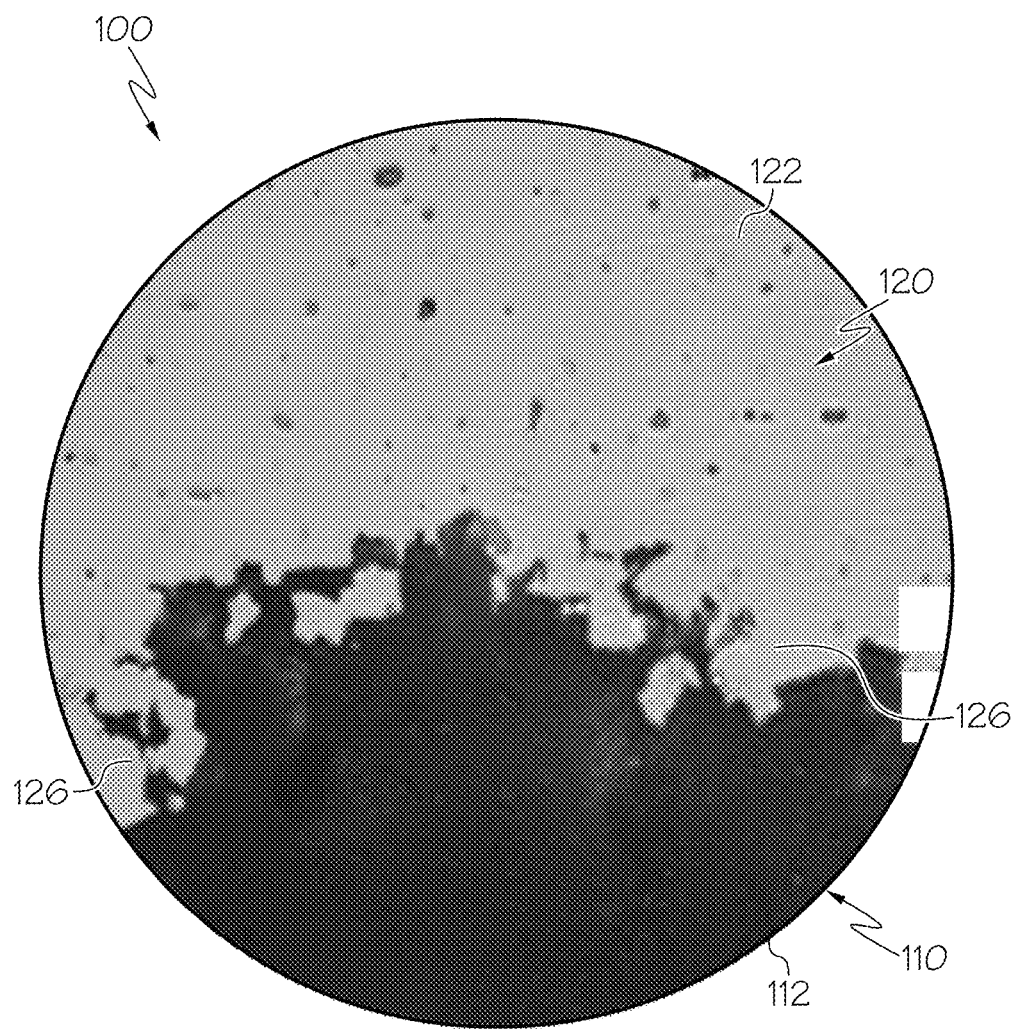
FIG. 8B schematically depicts an enlarged section view of an interface between the cold plate manifold and the heat sink base layer of FIG. 8A, according to one or more embodiments shown and described herein.

For example and referring to FIGS. 8A and 8B, a perspective view of the power electronics module 100 and an enlarged section view of an interface between the cold plate manifold 110 and the heat sink base layer 120 are schematically depicted, respectively. In embodiments, the heat sink base layer 120 is coupled to the cold plate manifold 110. For example, in some embodiments, the outwardly-extending engagement features 126 of the heat sink base layer 120 are at least partially embedded into the cold plate manifold 110.

For example, in embodiments in which the cold plate manifold 110 is a plastic cold plate manifold 110, the heat sink base layer 120 may be heated above a melting point of the cold plate manifold 110. As the heat sink base layer 120 is heated, the heat sink base layer 120 and the cold plate manifold 110 may be held together, such that the heat sink base layer 120 applies a pressure to the cold plate manifold 110. Once the heat sink base layer 120 is heated above the melting point of the cold plate manifold 110, at least a portion of the cold plate manifold 110 may melt and at least a portion of the heat sink base layer 120 may be pressed into the cold plate manifold 110 to couple the heat sink base layer 120 to the cold plate manifold 110. In embodiments in which the heat sink base layer 120 includes the outwardly-extending engagement features 126, the outwardly-extending engagement features 126 are heated and pressed into the cold plate manifold 110, such that at least a portion of the cold plate manifold 110 melts. As the portion of the cold plate manifold 110 melts from a solid state to a liquid state, the molten portion of the cold plate manifold 110 may flow around and envelop the outwardly-extending engagement features 126 of the heat sink base layer 120. The cold plate manifold 110 and the heat sink base layer 120 may then cool, either actively or passively, such that the cold plate manifold 110 solidifies around the outwardly-extending engagement features 126 of the heat sink base layer 120, thereby coupling the cold plate manifold 110 to the heat sink base layer 120. In this way, the heat sink base layer 120 (and accordingly the electrically-insulating layer 130, the one or more conductive substrates 140, and the one or more power electronics devices 150) may be coupled to the cold plate manifold 110 without the use of mechanical fasteners or additional sealing elements, thereby simplifying the assembly of the power electronics module 100. Moreover, by directly bonding the heat sink base layer 120 to the cold plate manifold 110, leakage of cooling fluid from the cold plate manifold 110 may be minimized as compared to configurations in which the cold plate manifold 110 is coupled to the heat sink base layer 120 through intermediate components.

Figure 9:
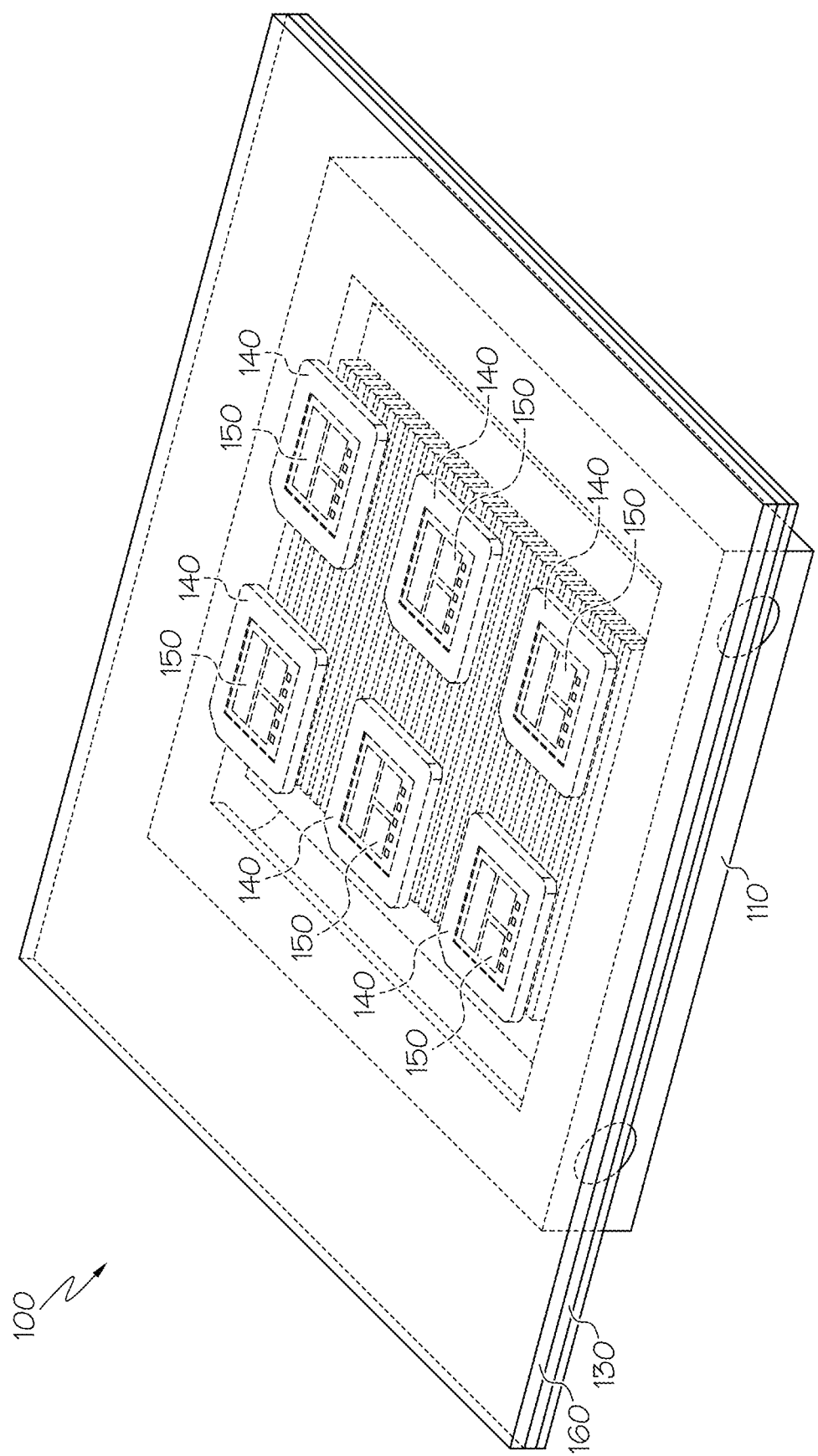
FIG. 9 schematically depicts a perspective view of the heat sink base layer, the electrically-insulating layer, the one or more conductive substrates, the one or more power electronics devices, the cold plate manifold, and a printed circuit board layer of the power electronics module of FIG. 1, according to one or more embodiments shown and described herein.

Referring to FIGS. 2, and 9 a perspective view of the cold plate manifold 110, the electrically-insulating layer 130, the one or more conductive substrates 140, the one or more power electronics devices 150, and the printed circuit board layer 160 is schematically depicted. With the one or more power electronics devices 150 positioned on and coupled to the one or more conductive substrates 140 and the heat sink base layer 120 coupled to the cold plate manifold 110, the printed circuit board layer 160 may be positioned over the electrically-insulating layer 130 at least partially embedding the electrically-insulating layer 130, the one or more conductive substrates 140 and the one or more power electronics devices 150. In some embodiments, the printed circuit board layer 160 may include any suitable material, for example and without limitation, laminates, cotton paper, epoxy, woven glass, matte glass, polyester, or the like and combinations thereof. In some embodiments, the electrically-insulating layer 130 may include through holes through which the printed circuit board layer 160 may extend, which may assist in bonding the printed circuit board layer 160 to the electrically-insulating layer 130.

In some embodiments and referring to FIG. 2, the power electronics module 100 includes one or more conduits 154 for electrically coupling the one or more power electronics devices 150. In embodiments, the conduits 154, 154', 154", and 154''' may be utilized to connect positive, negative, and/or ground connections to the one or more power electronics devices 150. In some embodiments, the power electronics module 100 includes a conduit 154' that extends between a first power electronics device 150 and a second power electronics device 150 and electrically couples the first power electronics device 150 to the second power electronics device 150. In some embodiments, the first power electronics device 150 may be electrically coupled to the second power electronics device 150 through the conduit 154' and one or more of the conductive substrates 140. In embodiments, the power electronics devices 150 and the conductive substrates 140 are positioned between one or more of the conduits 154, 154', 154", and 154''' and the electrically-insulating layer 130. For example, in the orientation depicted in FIG. 2, the conduits 154, 154', 154", and 154''' are positioned above the power electronics devices 150. By positioning the power electronics devices 150 between the conduits 154, 154', 154", and 154''' and the electrically-insulating layer 130, the power electronics devices 150 may be positioned in direct contact with the conductive substrates 140, and the conductive substrates 140 may be positioned in direct contact with the electrically-insulating layer 130. Put another way, by positioning the power electronics devices 150 between the conduits 154, 154', 154", and 154''' and the electrically-insulating layer 130, the power electronics devices 150 may be positioned closer to the electrically-insulating layer 130 (and accordingly the cold plate manifold 110) as compared to configurations in which the conduits 154, 154', 154", and 154''' are positioned between the power electronics devices 150 and the electrically-insulating layer 130. While in the section view depicted in FIG. 2 the conduits 154, 154', 154", and 154''' are shown connecting two of the power electronics devices 150, it should be understood that some or all of the power electronics devices 150 of the power electronics module 100 can be coupled to one another by conduits. Further, while in the section view depicted in FIG. 2 the conduits 154, 154', 154", and 154''' are shown at different vertical positions above the power electronics devices 150, it should be understood that the conduits 154, 154', 154", and 154''' may be positioned at the same or at different heights.

In embodiments, by positioning the power electronics devices 150 in direct contact with conductive substrates 140 that are in direct contact with the electrically-insulating layer 130, thermal resistance between the electrically-insulating layer 130 and the power electronics devices 150 can be minimized. Further, by positioning the electrically-insulating layer 130 in direct contact with the cold plate manifold 110, thermal resistance between the electrically-insulating layer 130 and the cold plate manifold 110 can be minimized, thereby minimizing thermal resistance between the power electronics devices 150 and the cold plate manifold 110. In this way, the amount of heat transferred from the power electronics devices 150 to the cold plate manifold 110 can be increased as compared to configurations including intervening layers between the power electronics devices 150 and the conductive substrates 140, between the conductive substrates 140 and the electrically-insulating layer 130, or between the electrically-insulating layer 130 and the cold plate manifold 110. By increasing the amount of heat transferred from the power electronics devices 150, the power electronics devices 150 may be maintained at a lower operating temperature. Alternatively, the power electronics devices 150 may operate at an increased power output as compared to conventional configurations while being maintained at a similar operating temperature.

Figure 10:
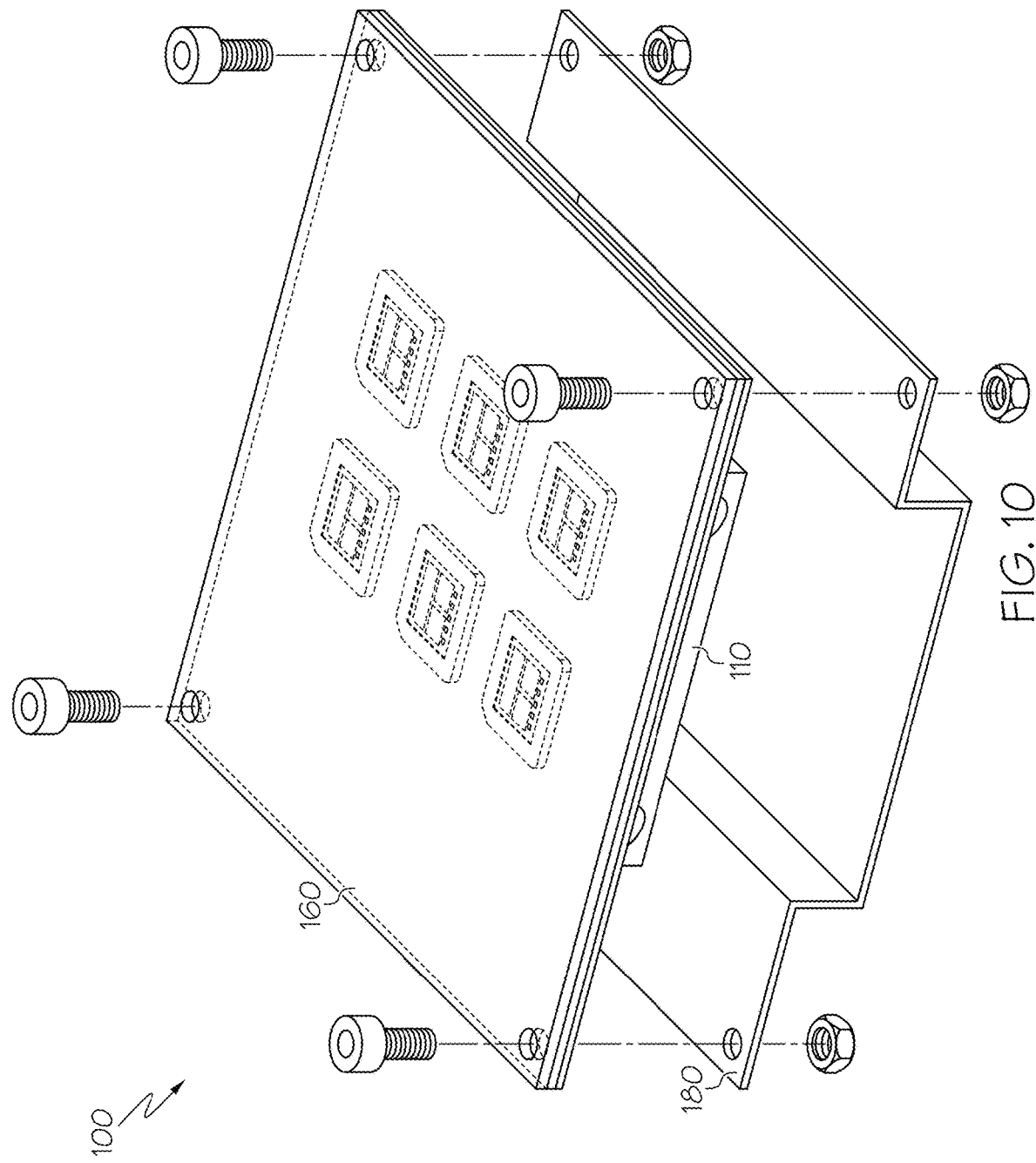
FIG. 10 schematically depicts an exploded perspective view of the power electronics module of FIG. 1 with a clamp, according to one or more embodiments shown and described herein.

Referring to FIG. 10 in some embodiments, the power electronics module 100 includes a clamp 180 that can be coupled to the cold plate manifold 110, the electrically-insulating layer 130 (FIG. 7B), and/or the printed circuit board layer 160. The clamp 180, in embodiments, generally extends around the cold plate manifold 110, and may at least partially encapsulate the cold plate manifold 110. The clamp 180 may be coupled to the cold plate manifold 110, the electrically-insulating layer 130 (FIG. 7B), and/or the printed circuit board layer 160 in any suitable manner, for example through mechanical fasteners such as bolts. The clamp 180 may support the cold plate manifold 110, the electrically-insulating layer 130 (FIG. 7B), and/or the printed circuit board layer 160, and may resist torsional forces applied to the cold plate manifold 110, the electrically-insulating layer 130 (FIG. 7B), and/or the printed circuit board layer 160. While in the embodiment depicted in FIG. 8 the clamp 180 is shown as a planar structure, it should be understood that this is merely an example, and the clamp 180 may include any suitable structure to resist torsional forces.

Figure 11:
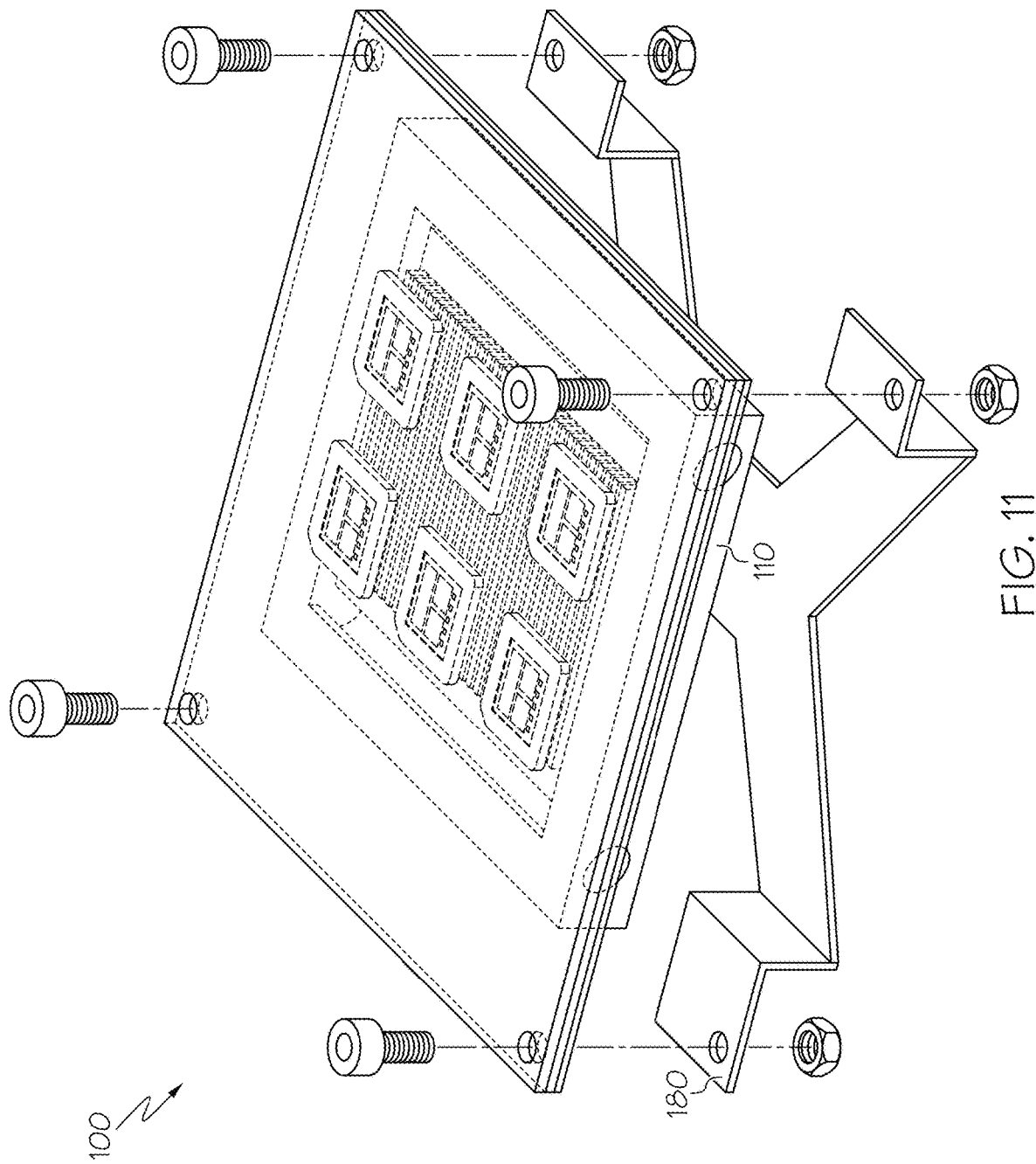
FIG. 11 schematically depicts an exploded perspective view of the power electronics module of FIG. 1 and another clamp, according to one or more embodiments shown and described herein.

For example and referring to FIG. 11, in some embodiments, the clamp 180 may include a cross or X-shape coupled to opposing corners of the cold plate manifold 110, the electrically-insulating layer 130 (FIG. 7B), and/or the printed circuit board layer 160.

It should now be understood that embodiments described herein are directed to power electronics modules including a heat sink base layer that is directly bonded to a cold plate manifold. For example, in embodiments according to the present disclosure, the heat sink base layer may include one or more engagement features that are at least partially embedded within the cold plate manifold to couple the heat sink base layer to the cold plate manifold, thereby coupling the heat sink base layer to the cold plate manifold without requiring the use of mechanical fasteners. In some embodiments, power electronics modules according to the present disclosure generally include power electronics devices in direct contact with conductive substrates that are in direct contact with an electrically-insulating layer. The electrically-insulating layer is in direct contact with a cold plate manifold. The direct contact between the conductive substrates and the cold plate manifold with the electrically-insulating layer minimizes intermediate components positioned between the power electronics devices and the cold plate manifold, thereby minimizing thermal resistance between the power electronics devices and the cold plate manifold. By minimizing thermal resistance between the power electronics devices and the cold plate manifold, the amount of heat dissipated from the power electronics devices can be increased as compared to configurations including intermediate components positioned between the power electronics devices and the cold plate manifold. By increasing the amount of heat that can be dissipated from the power electronics devices, the power electronics devices fan be maintained at lower operating temperatures. Additionally, by increasing the amount of heat that can be dissipated from the power electronics devices, the power electronics devices can be operated at higher power outputs while maintaining a similar operating temperature as compared to conventional configurations.

Having described the subject matter of the present disclosure in detail and by reference to specific embodiments, it is noted that the various details described in this disclosure should not be taken to imply that these details relate to elements that are essential components of the various embodiments described in this disclosure, even in cases where a particular element is illustrated in each of the drawings that accompany the present description. Rather, the appended claims should be taken as the sole representation of the breadth of the present disclosure and the corresponding scope of the various embodiments described in this disclosure. Further, it should be apparent to those skilled in the art that various modifications and variations can be made to the described embodiments without departing from the spirit and scope of the claimed subject matter. Thus it is intended that the specification cover the modifications and variations of the various described embodiments provided such modification and variations come within the scope of the appended claims and their equivalents.

It is noted that recitations herein of a component of the present disclosure being "structurally configured" in a particular way, to embody a particular property, or to function in a particular manner, are structural recitations, as opposed to recitations of intended use. More specifically, the references herein to the manner in which a component is "structurally configured" denotes an existing physical condition of the component and, as such, is to be taken as a definite recitation of the structural characteristics of the component.

It is noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention it is noted that the terms "substantially" and "about" are utilized herein to represent the inherent degree of uncertainty that may be attributed to any quantitative comparison, value, measurement, or other representation. The terms "substantially" and "about" are also utilized herein to represent the degree by which a quantitative representation may vary from a stated reference without resulting in a change in the basic function of the subject matter at issue.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A power electronics module comprising:
    a cold plate manifold;
    a heat sink base layer at least partially embedded in the cold plate manifold;
    an electrically-insulating layer in direct contact with the heat sink base layer;
    a conductive substrate positioned on the electrically-insulating layer;
    a power electronics device coupled to and in direct contact with the conductive substrate; and
    a printed circuit board layer that at least partially encapsulates the conductive substrate and the power electronics device.

2. The power electronics module of claim 1, wherein the heat sink base layer defines an etched surface comprising at least one engagement feature embedded within the heat sink.

3. The power electronics module of claim 1, wherein the heat sink defines an inlet and an outlet, and a fluid passageway that extends between the inlet and the outlet.

4. The power electronics module of claim 3, wherein the heat sink base layer comprises at least one fin that is positioned at least partially within the fluid passageway.

5. The power electronics module of claim 1, further comprising a driver circuit component positioned on a surface of the printed circuit board layer.

6. The power electronics module of claim 1, further comprises a clamp coupled to the electrically-insulating layer and extending around the heat sink base layer.

7. The power electronics module of claim 1, wherein the power electronics device is a first power electronics device, and the power electronics module further comprises a second power electronics device electrically coupled to the first power electronics device.

8. The power electronics module of claim 7, wherein the first power electronics device and the second power electronics device are electrically coupled by a conduit, wherein the first power electronics device and the second power electronics device are positioned between the conduit and the electrically-insulating layer.

9. A method for forming a power electronics module, the method comprising:
- positioning a conductive substrate over and in direct contact with a first surface of an electrically-insulating layer;
- positioning a heat sink base layer over and in direct contact with a second surface of the electrically-insulating layer opposite the conductive substrate;
- coupling a power electronics device to the conductive substrate such that the power electronics device is in direct contact with the conductive substrate;
- pressing the heat sink base layer into a plastic cold plate manifold;
- heating the heat sink base layer, thereby melting at least a portion of the plastic cold plate manifold to couple the heat sink base layer to the plastic cold plate manifold such that the heat sink base layer is at least partially embedded in the cold plate manifold; and
- positioning a printed circuit board layer over the power electronics device and the conductive substrate such that the printed circuit board layer at least partially encapsulating the power electronics device.

10. The method of claim 9, further comprising forming at least one fin extending outward from the heat sink base layer.

11. The method of claim 9, further comprising forming an engagement feature extending outward from the heat sink base layer, and wherein pressing the heat sink base layer into the plastic cold plate manifold comprises pressing the engagement feature into the plastic cold plate manifold.

12. The method of claim 9, further comprising coupling a clamp to the cold plate manifold.

13. The method of claim 9, further comprising positioning a driver circuit component on a surface of the printed circuit board layer.

14. A power electronics module comprising:
- a cold plate manifold structurally configured to dissipate thermal energy;
- a heat sink base layer directly bonded to the cold plate manifold;
- an electrically-insulating layer in direct contact with the heat sink base layer;
- a conductive substrate positioned on and in direct contact with the electrically-insulating layer;
- a power electronics device positioned on and in direct contact with the conductive substrate;
- a printed circuit board layer that at least partially encapsulates the conductive substrate and the power electronics device; and
- a driver circuit component positioned on a surface of the printed circuit board layer.

15. The power electronics module of claim 14, wherein the heat sink base layer defines an etched surface comprising at least one engagement feature embedded within the cold plate manifold.

16. The power electronics module of claim 14, wherein the cold plate manifold defines an inlet and an outlet, and a fluid passageway that extends between the inlet and the outlet.

17. The power electronics module of claim 16, wherein the heat sink base layer comprises at least one fin that is positioned at least partially within the fluid passageway.

18. The power electronics module of claim 14, wherein the power electronics device is a first power electronics device, and the power electronics module further comprises a second power electronics device electrically coupled to the first power electronics device.

* * * * *

UNITED STATES PATENT AND TRADEMARK OFFICE
CERTIFICATE OF CORRECTION

| | | |
|---|---|---|
| PATENT NO. | : 11,388,839 B2 | Page 1 of 1 |
| APPLICATION NO. | : 16/993736 | |
| DATED | : July 12, 2022 | |
| INVENTOR(S) | : Feng Zhou and Shohei Nagai | |

It is certified that error appears in the above-identified patent and that said Letters Patent is hereby corrected as shown below:

On the Title Page

Item (71), applicant 2, city, delete "Toyota" and insert --Toyota-shi, Aichi-ken--, therefor.

Item (73), assignee 2, city, delete "Aichi-ken" and insert --Toyota-shi, Aichi-ken--, therefor.

Signed and Sealed this
Eleventh Day of October, 2022

Katherine Kelly Vidal
*Director of the United States Patent and Trademark Office*